US012630923B2

(12) United States Patent
Kim et al.

(10) Patent No.: US 12,630,923 B2
(45) Date of Patent: May 19, 2026

(54) FLOW VELOCITY INCREASING DEVICE AND APPARATUS FOR DEPOSITING THIN FILM INCLUDING THE SAME

(71) Applicant: SEMES CO., LTD., Chungcheongnam-do (KR)

(72) Inventors: Sun Il Kim, Chungcheongnam-do (KR); Sung Nam Yoo, Chungcheongnam-do (KR); Jin Il Sung, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 525 days.

(21) Appl. No.: 18/107,558

(22) Filed: Feb. 9, 2023

(65) Prior Publication Data

US 2023/0313374 A1      Oct. 5, 2023

(30) Foreign Application Priority Data

Apr. 1, 2022      (KR) ........................ 10-2022-0041111

(51) Int. Cl.
*C23C 16/455*          (2006.01)

(52) U.S. Cl.
CPC .. *C23C 16/45544* (2013.01); *C23C 16/45527* (2013.01); *C23C 16/45563* (2013.01)

(58) Field of Classification Search
CPC ............ C23C 16/045; C23C 16/45563; C23C 16/4584; C23C 16/45555; C23C 16/45587; C23C 16/45589; C23C 16/45591; C23C 16/45502
See application file for complete search history.

(56) References Cited

U.S. PATENT DOCUMENTS

| | | | |
|---|---|---|---|
| 6,562,735 B1* | 5/2003 | Allman ............. | H01L 21/02211 438/758 |
| 2006/0219362 A1* | 10/2006 | Han .................... | H01J 37/3244 156/345.33 |
| 2012/0067971 A1* | 3/2012 | Byun ................ | C23C 16/45576 239/106 |
| 2013/0306758 A1* | 11/2013 | Park ..................... | C23C 16/509 239/418 |
| 2014/0225854 A1* | 8/2014 | Ashikawa ............. | G06F 3/0488 345/173 |
| 2017/0051404 A1 | 2/2017 | Sieber et al. | |

(Continued)

FOREIGN PATENT DOCUMENTS

| | | |
|---|---|---|
| JP | 2015-100720 A | 6/2015 |
| KR | 10-2006-0105090 A | 10/2006 |
| KR | 10-2012-0056878 A | 6/2012 |

(Continued)

OTHER PUBLICATIONS

Korean Office Action dated May 17, 2024 issued in the corresponding KR Patent Application No. 10-2022-0041111, with English translation.

*Primary Examiner* — Joseph A Miller, Jr.
(74) *Attorney, Agent, or Firm* — Carter, DeLuca & Farrell LLP

(57)          ABSTRACT

A flow velocity increasing device of an apparatus for depositing a thin film includes a device body disposed within the chamber and a flow velocity increasing hole portion formed in the device body and tapered in a direction of gas passage so that a flow velocity of passed gas is faster than that externally.

10 Claims, 11 Drawing Sheets

<u>10</u>

(56)            References Cited

U.S. PATENT DOCUMENTS

| | | |
|---|---|---|
| 2021/0395886 A1 | 12/2021 | Dip |
| 2022/0140307 A1 | 5/2022 | Darolles et al. |

FOREIGN PATENT DOCUMENTS

| | | |
|---|---|---|
| KR | 10-2018-0115238 A | 10/2018 |
| KR | 10-2021-0109190 A | 9/2021 |
| KR | 10-2021-0157451 A | 12/2021 |
| KR | 10-2022-0023966 A | 3/2022 |
| WO | 2011/041255 A1 | 4/2011 |
| WO | 2017/141144 A2 | 8/2017 |

\* cited by examiner

A 500 510

500 510

522a

510a

521

510a $$520 \begin{cases} 521 \\ 522 \\ 523 \end{cases}$$

522a 522 523

B

1000

1000

500

SOURCE GAS

PURGE GAS

REACTANT GAS 1a   1   600

1000

500

SOURCE GAS

PURGE GAS

REACTANT GAS 1a   1   600

FLOW VELOCITY INCREASING DEVICE AND APPARATUS FOR DEPOSITING THIN FILM INCLUDING THE SAME

CROSS-REFERENCE TO RELATED APPLICATION(S)

This application claims benefit of priority to Korean Patent Application No. 10-2022-0041111 filed on Apr. 1, 2022 in the Korean Intellectual Property Office, the disclosure of which is incorporated herein by reference in its entirety.

BACKGROUND

1. Field

The present disclosure relates to a flow velocity increasing device for thin film deposition and an apparatus for depositing a thin film including the same.

2. Description of Related Art

Due to the development of semiconductor integration technology, a process of depositing high-purity, high-quality thin films has become an important part of the semiconductor manufacturing process. Representative methods of thin film formation include a chemical vapor deposition (CVD) method and a physical vapor deposition (PVD) method. Here, since step coverage of a formed thin film is poor, the PVD method cannot be used to form a film having a uniform thickness on an uneven surface. The CVD method is a method in which gaseous substances react on a surface of a heated substrate and a compound produced by the reaction is deposited on the surface of the substrate. Compared to the PVD method, the CVD method has been widely applied because it has better step coverage, does less damage to the substrate on which a thin film is deposited, incurs less costs for thin film deposition, and allows for mass production of thin films.

However, as the degree of integration of semiconductor devices has recently improved to a sub-micron level, there is a limitation in obtaining a uniform thickness of the sub-micron level on a wafer substrate or excellent step coverage with the CVD method of the related art, and there is difficulty in obtaining a material film having a certain composition, regardless of position, when a step such as sub-micron-sized contact holes, vias, or trenches exist on a wafer substrate.

Therefore, an atomic layer deposition (ALD) method of forming a thin film by sequentially dividedly supplying two or more process gasses required to obtain a desired thin film over time so that the process gases may not meet in a gas phase, but with a supply cycle periodically repeated to form the thin film, may be applied as a new thin film formation method.

On the other hand, parts, such as nozzles that are not substrates may also be treated with thin film deposition coating, and holes with closed insides may be formed in these parts (objects to be deposited). However, there is a limitation in that deposition is not uniformly performed in the closed hole as a gas cannot be smoothly circulated inside the hole unless a flow velocity of the gas is rapid.

RELATED ART DOCUMENT

Patent Document (Patent document 1) Korean Patent Laid-Open Publication No. 10-2021-0109190

SUMMARY

Exemplary embodiments provide an apparatus for depositing a thin film, capable of performing uniform thin film deposition on various steps or closed holes of an object to be deposited.

According to an aspect of the present disclosure, a flow velocity increasing device of an apparatus for depositing a thin film includes: a device body disposed within the chamber; and a flow velocity increasing hole portion formed in the device body and tapered in a direction of gas passage so that a flow velocity of passed gas is faster than that externally.

The flow velocity increasing hole portion may include a gas inlet through which gas flows in and a gas outlet through which gas flows out, and a flow velocity increasing portion connecting the gas inlet and the gas outlet and having a cross-sectional area less than the gas inlet and the gas outlet.

An inner surface of the flow velocity increasing portion may be inwardly convex.

A front end of the device body disposed around the gas inlet may be formed to be curved.

The flow velocity increasing device may further include: a device driving unit connected to the device body and moving a position of the device body so that a position of the flow velocity increasing hole portion is moved.

The flow velocity increasing device may further include: a device tilting unit connected to the device body and tilting the device body so that the flow velocity increasing hole portion is tilted;

The device body may be provided in plural and the plurality of device bodies may be arranged not to interfere with each other in a gas passage direction through the flow velocity increasing hole portion.

A surface roughness of an inner surface of the flow velocity increasing hole may be less than 0.01 μm.

According to another aspect of the present disclosure, an apparatus for depositing a thin film includes: a chamber having a gas injection portion including a source gas nozzle, a reactant gas nozzle, and a purge gas nozzle, and a gas discharge port; a vacuum pump connected to the chamber; and a flow velocity increasing device disposed within the chamber, wherein the flow velocity increasing device includes: a device body disposed within the chamber; and a flow velocity increasing hole portion formed in the device body and tapered in a direction of gas passage so that a flow velocity of passed gas is faster than that externally.

The flow velocity increasing hole may have a length direction disposed on an extension of a direction in which a gas is injected through the gas injection portion.

The apparatus may further include; a holder disposed in the chamber and holding an object to be deposited; an object driving unit connected to the holder and moving a position of the holder so that the object to be deposited is moved; and an object tilting unit connected to the holder and tilting the holder so that the object to be deposited is tilted.

The apparatus may further include: a holder disposed in the chamber and holding an object to be deposited; an object rotating unit connected to the holder and rotating the holder so that the object to be deposited rotates; and an object revolving unit connected to the holder and revolving the holder so that the object to be deposited revolves.

The apparatus may further include: a gas distribution unit disposed between the gas injection portion and the flow velocity increasing device to distribute a gas injected through the gas injection portion, wherein the gas distribution unit includes: a distribution housing communicating with the gas injection portion and having a gas accommodating space therein; and a plurality of distribution holes formed at a rear end of the distribution housing disposed to be adjacent to the flow velocity increasing device and spaced apart from each other at a predetermined interval.

According to another aspect of the present disclosure, an apparatus for depositing a thin film includes: a source gas supply tank supplying a source gas; a reactant gas supply tank supplying a reactant gas; a purge gas supply tank supplying purge gas; a chamber having a gas injection portion including a source gas nozzle connected to the source gas supply tank, a reactant gas nozzle connected to the reactant gas supply tank, and a purge gas nozzle connected to the purge gas supply tank, and a gas discharge port; a vacuum pump connected to the chamber; and a flow velocity increasing device disposed within the chamber, wherein the flow velocity increasing device includes: a device body disposed within the chamber; and a flow velocity increasing hole portion formed in the device body and tapered in a direction of gas passage so that a flow velocity of passed gas is faster than that externally.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
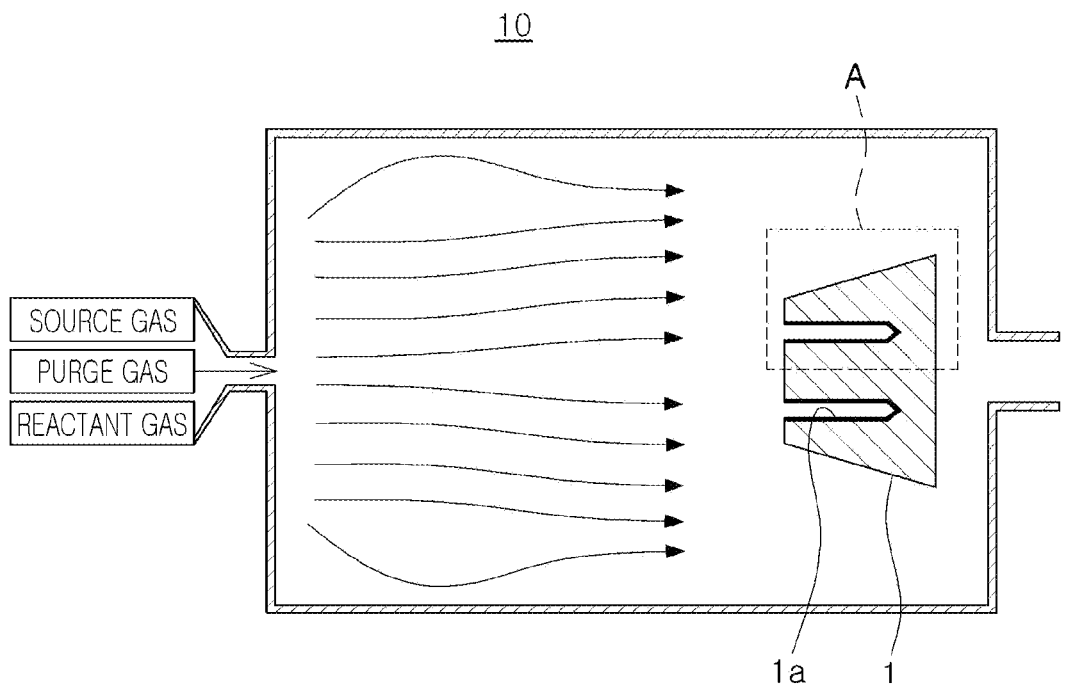
FIG. 1 is a view illustrating an apparatus for depositing a thin film according to the related art.

Hereinafter, exemplary embodiments will be described in detail with reference to the accompanying drawings such that they may be easily practiced by those skilled in the art to which the present disclosure pertains. In describing the present disclosure, if a detailed explanation for a related known function or construction is considered to unnecessarily divert the gist of the present disclosure, such explanation will be omitted but would be understood by those skilled in the art. Also, similar reference numerals are used for the similar parts throughout the specification. In this disclosure, terms, such as "above", "upper portion", "upper surface", "below", "lower portion", "lower surface", "lateral surface", and the like, are determined based on the drawings, and in actuality, the terms may be changed according to a direction in which a device or an element is disposed.

It will be understood that when an element is referred to as being "connected to" another element, it may be directly connected to the other element or intervening elements may also be present. In contrast, when an element is referred to as being "directly connected to" another element, no intervening elements are present. In addition, unless explicitly described to the contrary, the word "comprise" and variations, such as "comprises" or "comprising," will be understood to imply the inclusion of stated elements but not the exclusion of any other elements.

Figure 2:
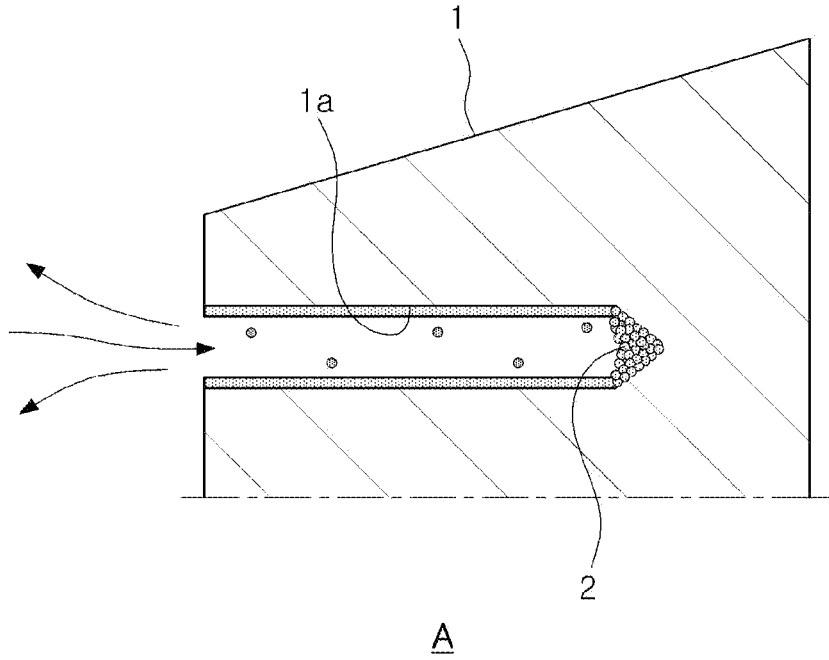
FIG. 2 is an enlarged view illustrating portion A of FIG. 1.

FIG. 1 is a view illustrating an apparatus for depositing a thin film according to the related art, and FIG. 2 is an enlarged view illustrating portion A in FIG. 1.

Referring to the drawings, an apparatus 10 for depositing a thin film according to the related art is difficult to secure deposition uniformity according to various types of objects to be deposited during thin film coating by atomic layer deposition (ALD).

ALD coating is a coating technique that forms a uniform coating thickness regardless of shape of an object 1 to be deposited to be coated. Specifically, ALD coating is a coating method using a source gas (precursor gas) and a reactant gas. However, when the source gas and the reactant gas are injected into an enclosed space including a hole (a groove structure) la with a closed inner side formed in the object 1 to be deposited, a flow velocity is not fast enough and circulating power may be reduced in the closed space so that the gases cannot escape. As a result, in a space with one side closed such as the closed hole of the object 1 to be deposited, uniformity of deposition is deteriorated and a dense deposition area 2 occurs.

Hereinafter, the present disclosure is configured so that gas may be injected into the closed hole 1*a* of the object 1 to be deposited at a high flow velocity to increase circulating power of gas for various steps of the object 1 to be deposited or the space closed in one side, such as the closed hole 1*a*, thereby uniformly and effectively performing thin film deposition.

Figure 3:
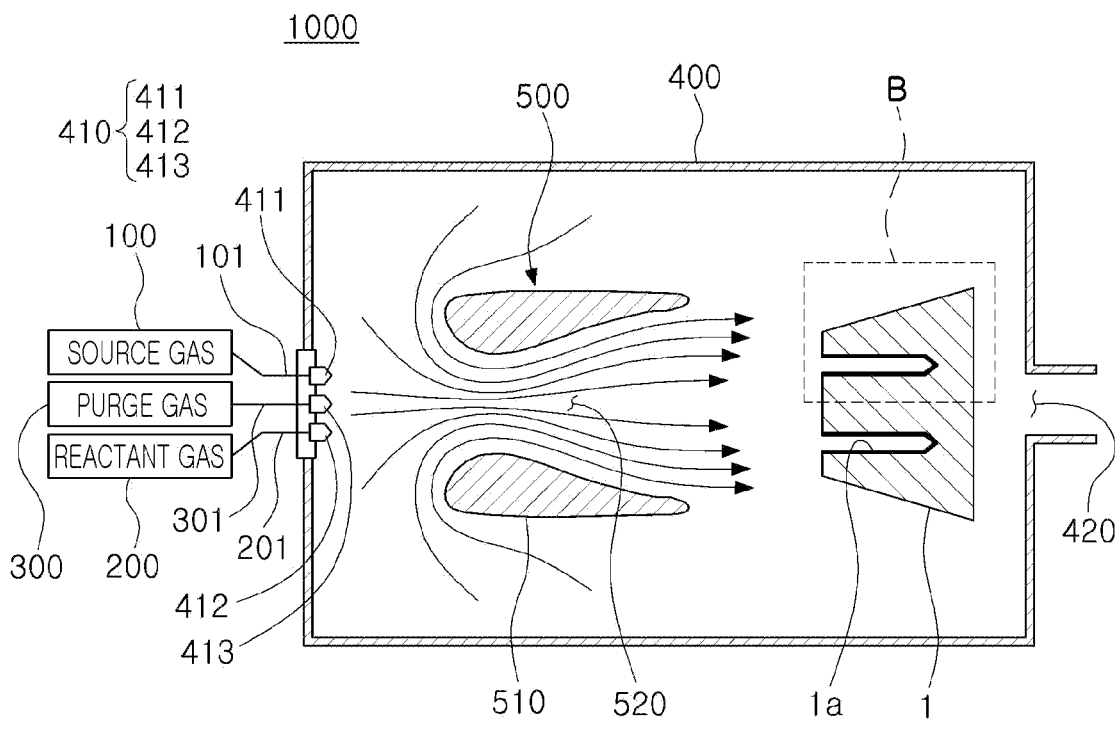
FIGS. 3 and 4 are views illustrating an apparatus for depositing a thin film according to a first exemplary embodiment in the present disclosure.
Figure 4:
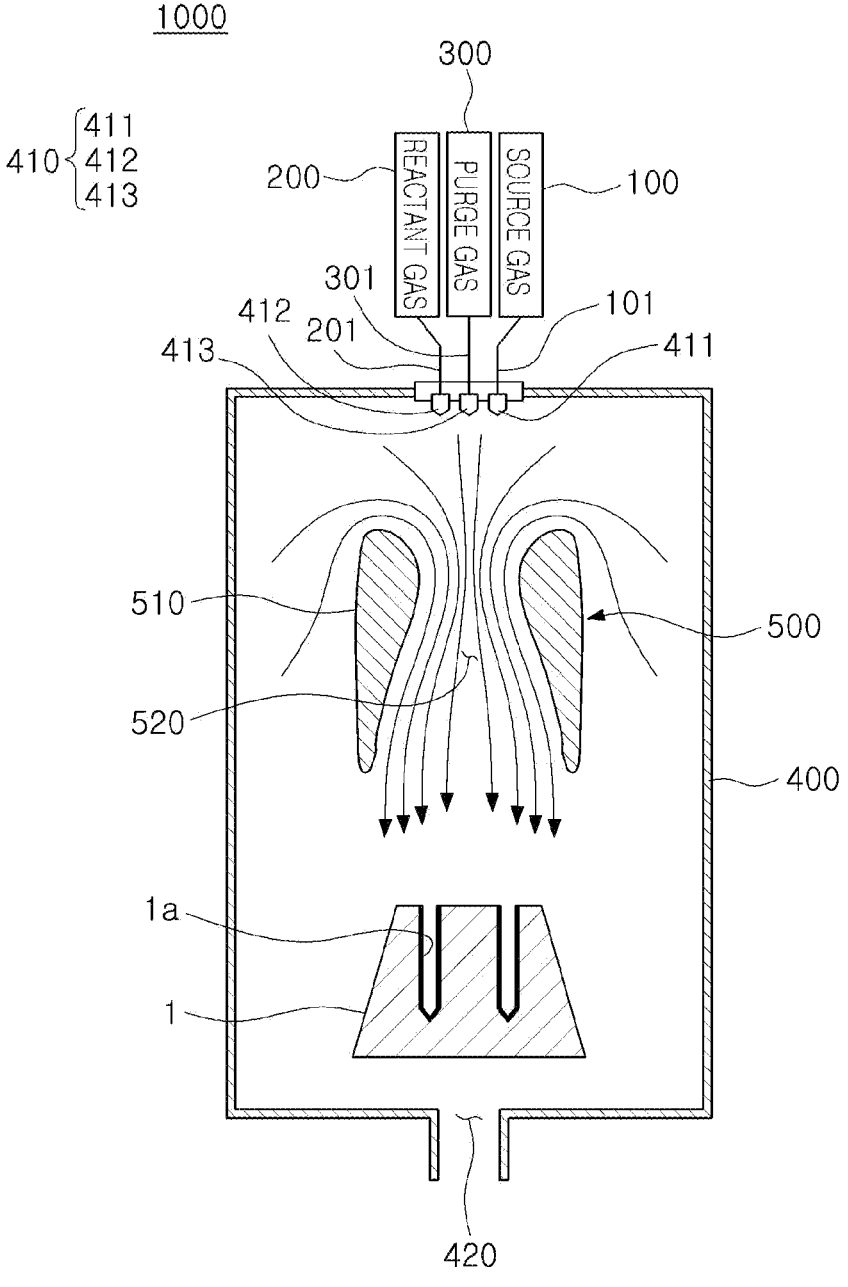
Figure 5A:
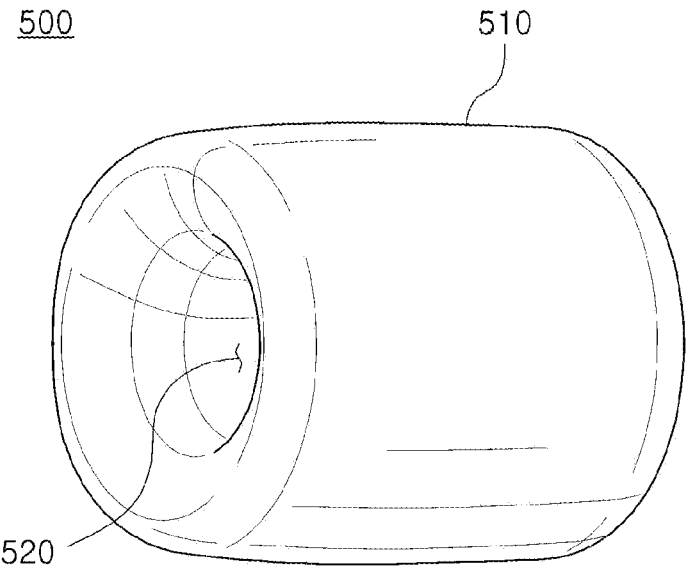
FIG. 5A is a perspective view illustrating a flow velocity increasing device of the apparatus for depositing a thin film of FIG. 3.
Figure 5B:
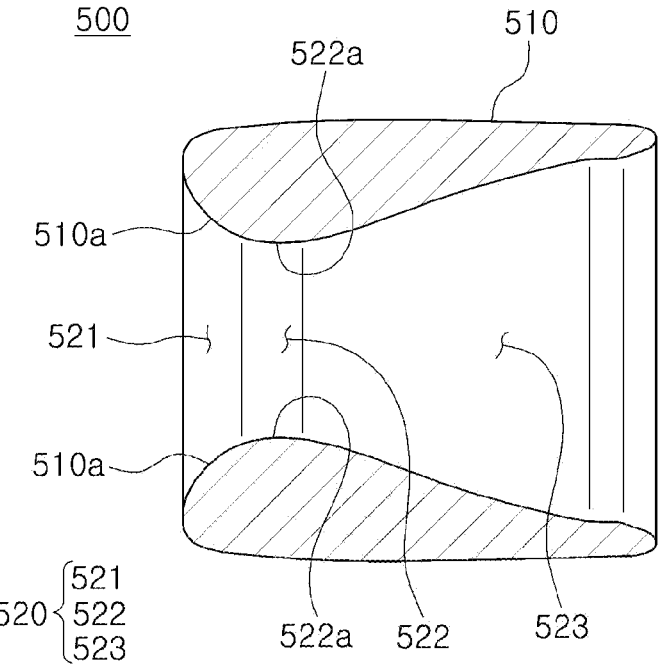
FIG. 5B is a cross-sectional view illustrating the flow velocity increasing device of FIG. 5A.
Figure 6:
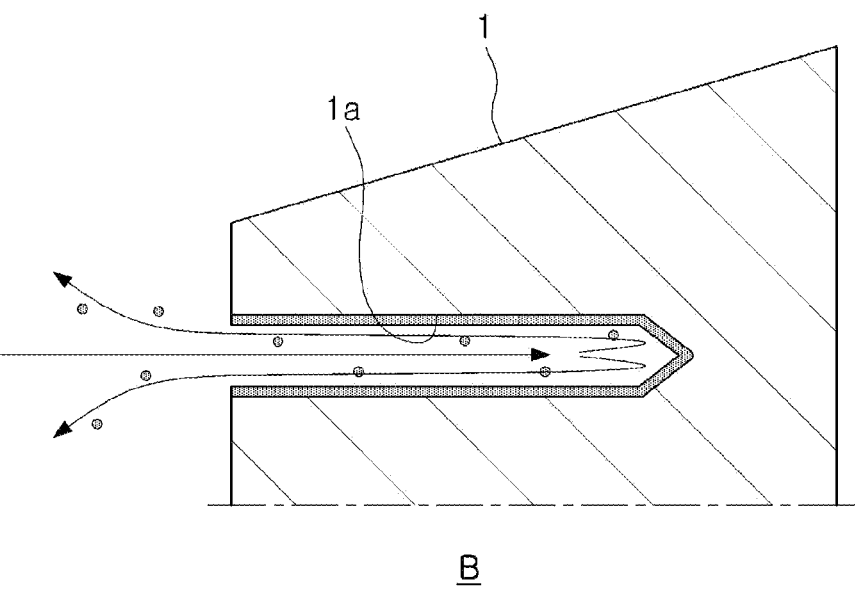
FIG. 6 is an enlarged view illustrating portion B of FIG. 3.

FIGS. 3 and 4 are views illustrating an apparatus for depositing a thin film according to a first exemplary embodiment in the present disclosure, FIG. 5 is a view illustrating a flow velocity increasing device of the apparatus for depositing a thin film of FIG. 3, and FIG. 6 is an enlarged view illustrating portion B in FIG. 3.

Referring to the drawings, an apparatus 1000 for depositing a thin film of the present disclosure is an apparatus for forming a thin film on an object 1 to be deposited using a deposition principle. Here, the object 1 to be deposited may be a substrate or a component. For example, the component is used in a chamber 400 for plasma etching a substrate, and is subjected to a thin film deposition process to have resistance to damage during a plasma process at an extremely high temperature. For example, if a nozzle, which is a part that sprays a chemical solution, is continuously used during a plasma process and is damaged, a minute error may occur in an injection angle of the chemical solution, which may cause a problem in a substrate processing process that requires precision. In order to prevent such a problem, the apparatus 1000 for depositing a thin film according to the present disclosure may improve durability against a plasma treatment by performing a thin film deposition process on the object 1 to be deposited.

Specifically, the apparatus 1000 for depositing a thin film of the present disclosure includes a source gas supply tank 100, a reactant gas supply tank 200, the chamber 400, a vacuum pump (not shown), and a flow velocity increasing device 500.

The source gas supply tank 100 is a tank accommodating source gas to supply the source gas to the chamber 400. The source gas is a gaseous material for coating (adsorption), and refers to a precursor gas in thin film deposition. Such a precursor is a material that help a reaction and is deposited by first reacting with a surface of the object 1 to be deposited, and the deposited precursor chemically reacts with a reactant gas supplied thereafter to form an atomic layer on the surface of the object 1 to be deposited.

In addition, the reactant gas supply tank 200 is a tank accommodating a reactant gas to supply the reactant gas to the chamber 400. As the reactant gas, $H_2O$, $O_3$, $O_2$, $H_2O_2$, etc. may be used as an oxidation reactant gas, or $NH_3$, $N_2H_4$, etc. may be used as a nitrification reactant gas.

In addition, a purge gas supply tank 300 is a tank accommodating purge gas to supply the purge gas to the chamber 400.

A process of ALD (one of several thin film deposition methods) by supplying gas from the source gas supply tank 100, the reactant gas supply tank 200, and the purge gas supply tank 300 configured as described above is described as follows. First, source gas is supplied to the chamber 400 to react with a surface of the object 1 to be deposited, and deposited thereon, and then purge gas is supplied to the chamber 400 to discharge (remove) source gas that has not been reacted but remained. Next, a reactant gas is supplied to the chamber 400 and reacts with the source gas on the surface of the object 1 to be deposited to form an atomic layer on the surface of the object to be deposited. Finally, purge gas is supplied to discharge (remove) the reactant gas that has not been reacted but remained. As the process described above is repeatedly performed, an atomic layer is formed on the surface of the object 1 to be deposited.

Also, the chamber 400 has a closed structure and has an internal space having an appropriate size to accommodate the object 1 to be deposited. The chamber 400 has a gas injection portion 410 and a gas discharge port 420. The gas injection portion 410 includes a source gas nozzle 411, a reactant gas nozzle 412, and a purge gas nozzle 413. Here, the source gas nozzle 411 is connected to the source gas supply tank 100 by a source gas supply pipe 101, the reactant gas nozzle 412 is connected to the reactant gas supply tank 200 by a reactant gas supply pipe 201, and the purge gas nozzle 413 is connected to the purge gas supply tank 300 by a purge gas supply pipe 301. In addition, the gas discharge port 420 is formed on the other side of the chamber 400 opposite to one side of the chamber where the gas injection portion 410 is formed. Here, as illustrated in FIG. 3 for example, the gas injection portion 410 may be disposed on one side of the chamber 400 and the gas discharge port 420 may be disposed on the other side thereof, and as another example, as illustrated in FIG. 4, the gas injection portion 410 may be disposed in an upper portion of the chamber 400 and the gas discharge port 420 may be disposed in a lower portion thereof. In addition, the chamber 400 is connected to a vacuum pump (not shown) so that an internal space thereof is evacuated so that there is no unnecessary gas therein. Such a vacuum pump may be connected to the gas discharge port 420, the gas injected through the gas injection portion 410 may be smoothly discharged through the gas discharge port 420.

Meanwhile, the flow velocity increasing device 500 includes a device body 510 and a flow velocity increasing hole portion 520.

The device body 510 is disposed within the chamber 400. The device body 510 is disposed between the gas injection portion 410 and the gas discharge port 420 in the chamber 400. Specifically, the device body 510 is disposed between the gas injection portion 410 and the object 1 to be deposited, so that the gas injected through the gas injection portion 410 may pass through the device body 510 to reach the object 1 to be deposited. In addition, the flow velocity increasing hole portion 520 is a portion formed in a hole structure in the device body 510. The flow velocity increasing hole portion 520 has a tapered structure in a gas passage direction so that a flow velocity of the passing gas is faster than that externally. That is, the flow velocity increasing hole portion 520 includes a structure in which a cross-sectional area is gradually reduced. This structure specifically ranges from from the gas inlet 521 of the flow velocity increasing device 500 to the flow velocity increasing portion 522 as described below. Due to this structure, the gas passing through the flow velocity increasing hole portion 520 in the chamber 400 has a relatively fast flow velocity compared to surrounding gas that does not pass through the flow velocity increasing hole portion 520.

Specifically, the flow velocity increasing hole portion 520 includes a gas inlet 521 through which gas flows in and a gas outlet 523 through which gas flows out. In addition, the flow velocity increasing hole portion 520 includes a flow velocity increasing portion 522 connecting the gas inlet 521 and the gas outlet 523. Here, a cross-sectional area of the flow velocity increasing portion 522 is smaller than those of the gate inlet 521 and the gas outlet 523. The structure of the flow velocity increasing hole portion 520 utilizes the Venturi effect (Bernoulli's theorem), and when the gas introduced through the gas inlet 521 passes through the flow velocity increasing portion 522 with a relatively small cross-section, a flow velocity becomes fast.

Furthermore, the cross-sectional area of the flow velocity increasing hole portion 520 gradually increases in the range from the flow velocity increasing portion 522 to the gas outlet 523, and this extended structure allows gas with a high flow rate to be supplied to the large-sized deposition object 1.

An inner surface 522a of the flow velocity increasing portion 522 is inwardly convex. The convex structure of the flow velocity increasing portion 522 implements a structure in which the cross-sectional area of the flow velocity increasing portion 522 is smaller than those of the gas inlet 521 and the gas outlet 523. Here, due to the convex structure of the flow velocity increasing portion 522, the inner surface of the flow velocity increasing hole portion 520 is formed to be longer than an outer surface of the device body 510 in the gas passage direction. According to the Coanda effect, the flow velocity of the gas passing on the inner surface of the flow velocity increasing hole portion 520 increases. In addition, as the pressure inside the flow velocity increasing hole portion 520 drops, the gas around the flow velocity gas device 500 is also attracted, so that a flow rate may be greater than that around the flow velocity gas device 500. Furthermore, this structure is a curved structure that receives the least flow resistance of the gas, and allows the gas to flow smoothly when passing to move to the gas outlet 523.

In addition, a front end portion 510a of the device body 510 disposed around the gas inlet 521 may be curved. That is, the front end portion 510a of the device body 510 may have a curved structure that receives the least flow resistance of gas, so that gas smoothly flows from the front end portion 510a of the device body 510 to the gas inlet 521 before being introduced through the gas inlet 521.

Furthermore, surface roughness of the inner surface of the flow velocity increasing hole portion 520 may be less than 0.01 μm. As a result, the gas flow is not interfered with as much as possible. That is, if the surface roughness of the inner surface of the flow velocity increasing hole portion 520 is 0.01 μm or more, the flow velocity of the gas may decrease due to friction with the flowing gas.

As described above, the present disclosure includes the flow velocity increasing device 500 in which the flow velocity increasing hole portion 520 is formed, so that the gas injected into the chamber 400 may be introduced at a high flow velocity into the space with one side closed, such as the closed hole 1a or various steps of the object 1 to be deposited, thereby increasing the circulating power of the gas, so that thin film deposition may be performed uniformly and effectively.

Figure 7:
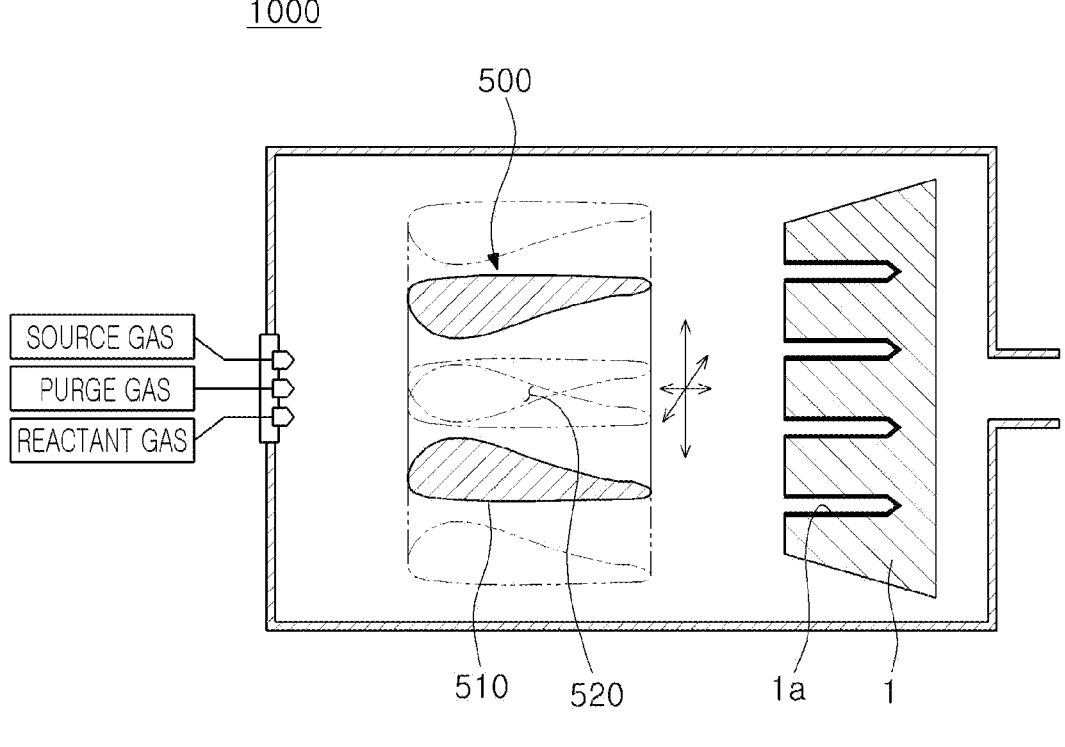
FIGS. 7 and 8 are views illustrating an apparatus for depositing a thin film according to a second exemplary embodiment in the present disclosure.
Figure 8:
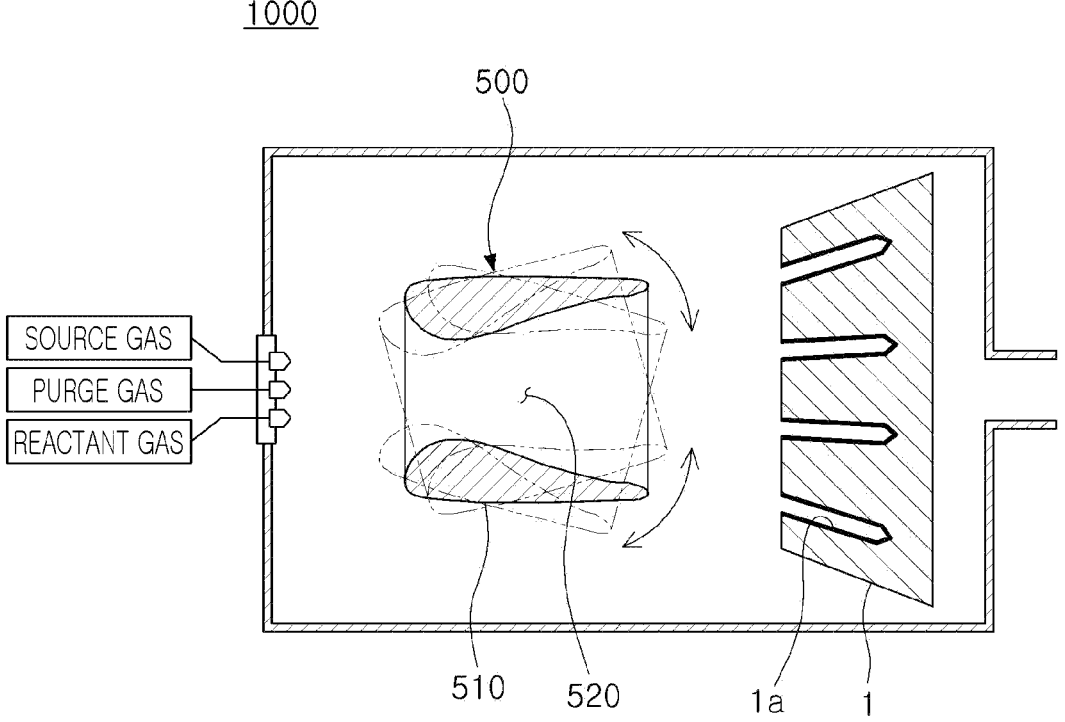

FIGS. 7 and 8 are views illustrating an apparatus for depositing a thin film according to a second exemplary embodiment in the present disclosure. Specifically, FIG. 7 is a view illustrating that the flow velocity increasing device moves in position, and FIG. 8 is a view illustrating that the flow velocity increasing device tilts.

Referring to the drawings, the apparatus 1000 for depositing a thin film of the present disclosure may further include a device driving unit (not shown).

As illustrated in FIG. 7, the device driving unit may be connected to the device body 510 to move the device body 510 in position, so that the flow velocity increasing hole portion 520 is moved. That is, the device driving unit has a structure connected to the device body 510, and is configured to move the device body 510 in lateral and longitudinal directions so that the position of the flow velocity increasing hole portion 520 may be moved. This device driving unit is a driving member that may be operated by a driving source of electricity, and but the present disclosure is not limited thereto and any conventional driving member may be used as long as it smoothly moves the device body 510.

For example, as illustrated in FIG. 7, when the size of the object 1 to be deposited is large and a plurality of holes 1a are formed over a wide range, in the present disclosure, the device body 510 may be moved by the device driving unit to move the position of the flow velocity increasing hole portion 520, so that uniform thin film deposition coating may be performed on the entire portion of the object 1 to be deposited.

In addition, the apparatus 1000 for depositing a thin film of the present disclosure may further include a device tilting unit (not shown).

As illustrated in FIG. 8, the device tilting unit may be connected to the device body 510 to tilt the device 510 so that the flow velocity increasing hole portion 520 is tilted. That is, the device tilting unit has a structure connected to the device body 510 and is configured to tilt the device body 510 so that the flow velocity increasing hole portion 520 may be tilted. This device tilting unit is a driving member that may be operated as a driving source of electricity, and the present disclosure is not limited thereto and any conventional driving member may be used as long as it smoothly tilts the device body 510.

For example, as illustrated in FIG. 8, when the size of the object 1 to be deposited is large and some of the plurality of holes 1a are formed inclined, in the present disclosure, the flow velocity increasing hole portion 520 may be tilted by tilting the device body 510 by the device tilting unit to perform a uniform thin film deposition coating on the entire portion of the object 1 to be deposited.

Figure 9:
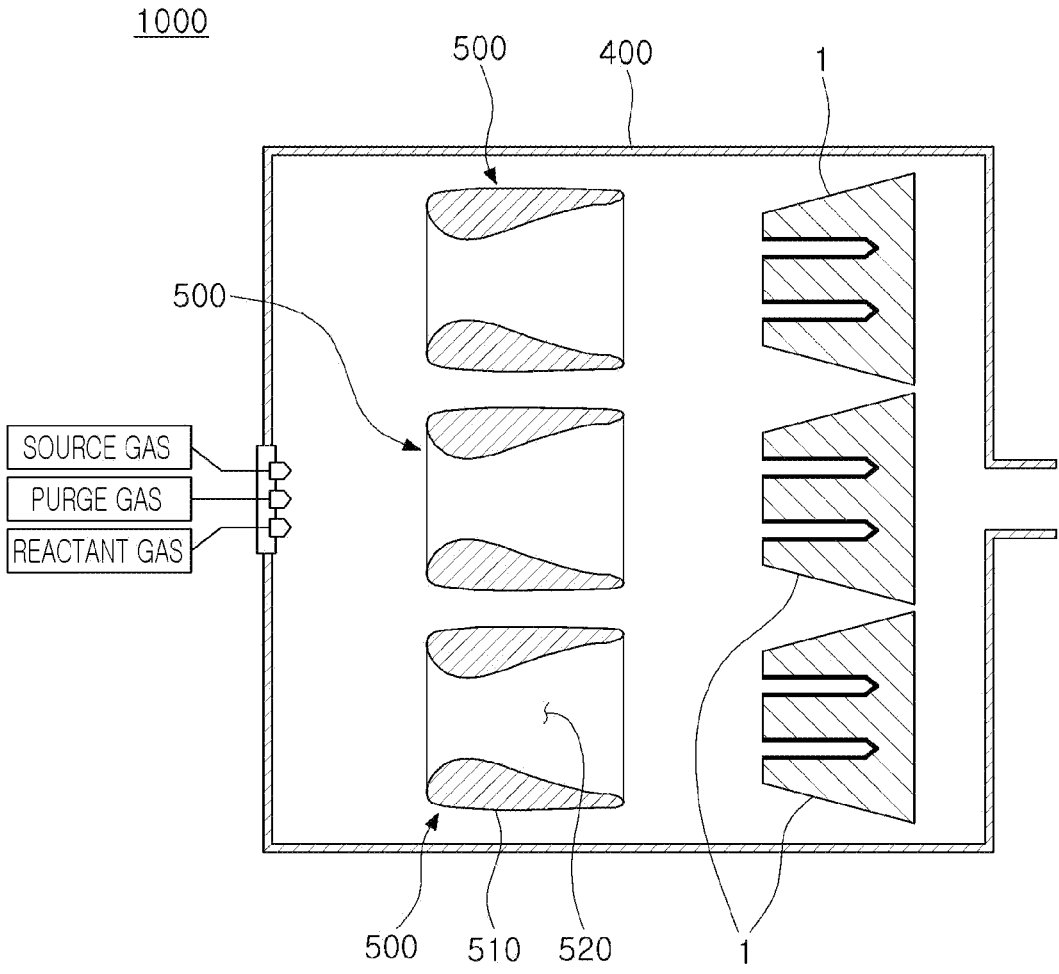
FIG. 9 is a view illustrating an apparatus for depositing a thin film according to a third exemplary embodiment in the present disclosure.

FIG. 9 is a view illustrating an apparatus for depositing a thin film according to a third exemplary embodiment in the present disclosure. Specifically, FIG. 9 is a view illustrating that a plurality of flow velocity increasing devices are arranged.

Referring to the drawings, in the apparatus 1000 for depositing a thin film of the present disclosure, a plurality of device bodies 510 may be arranged not to interfere with each other in a gas passage direction through the flow velocity increasing hole portion 520. That is, a plurality of flow velocity increasing devices 500 may be arranged in the chamber 400, and here, gas may be disposed so that gases may not pass through the flow velocity increasing hole portions 520 of other flow velocity increasing devices 500.

For example, as illustrated in the drawing, when a plurality of object 1 to be deposited are arranged in the chamber 400, in the present disclosure, a plurality of flow velocity increasing devices 500 are arranged to correspond thereto, thereby performing uniform thin film deposition coating on the plurality of objects 1 to be deposited.

FIGS. 10 to 13 show an apparatus for depositing a thin film according to a fourth exemplary embodiment in the present disclosure.

Figure 10:
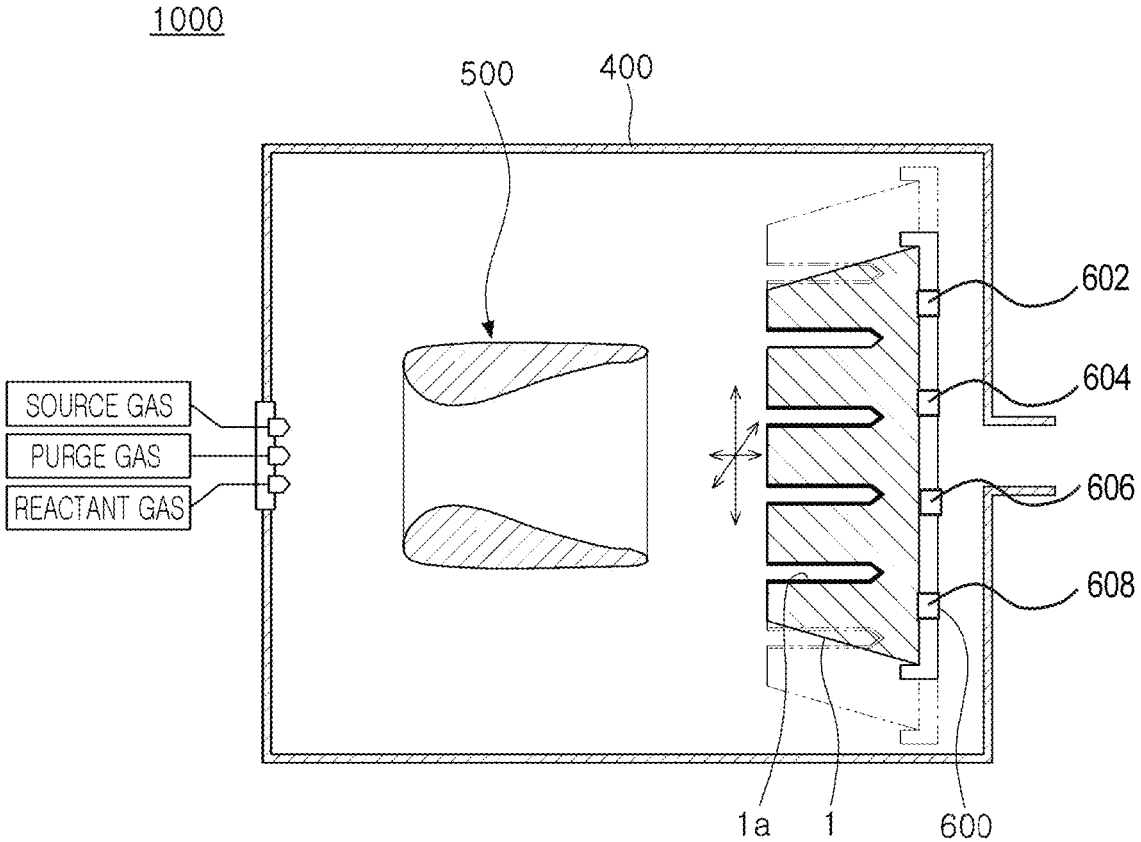
FIGS. 10 to 13 are views illustrating an apparatus for depositing a thin film according to a fourth exemplary embodiment in the present disclosure.
Figure 11:
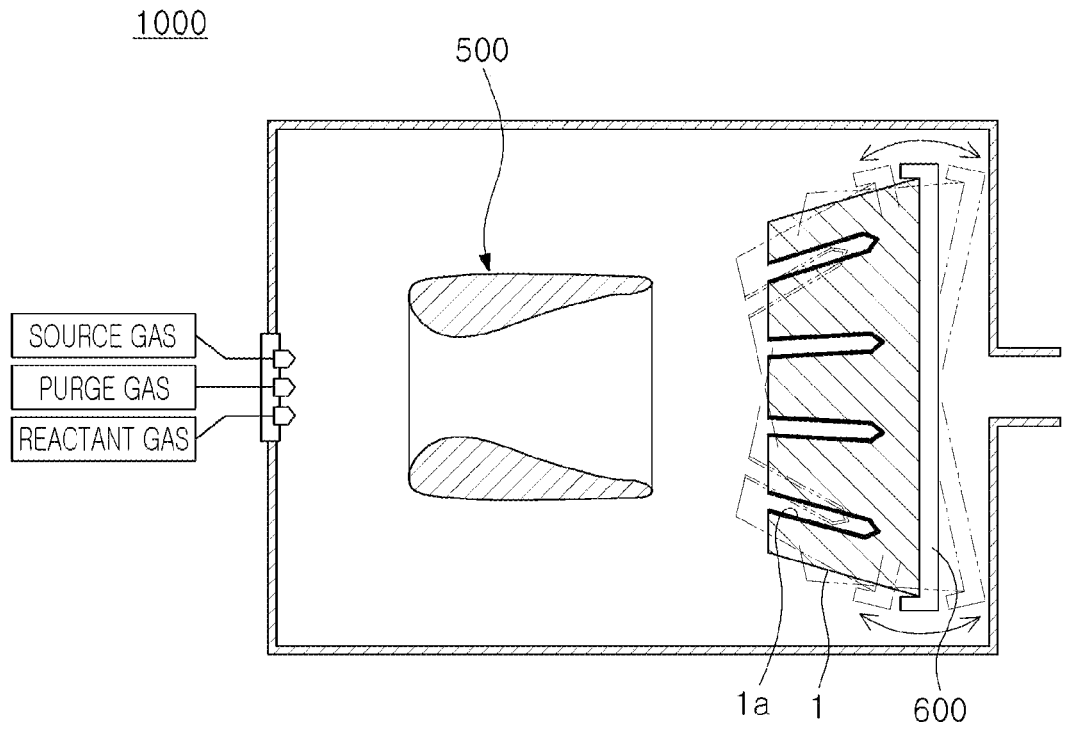
Figure 12:
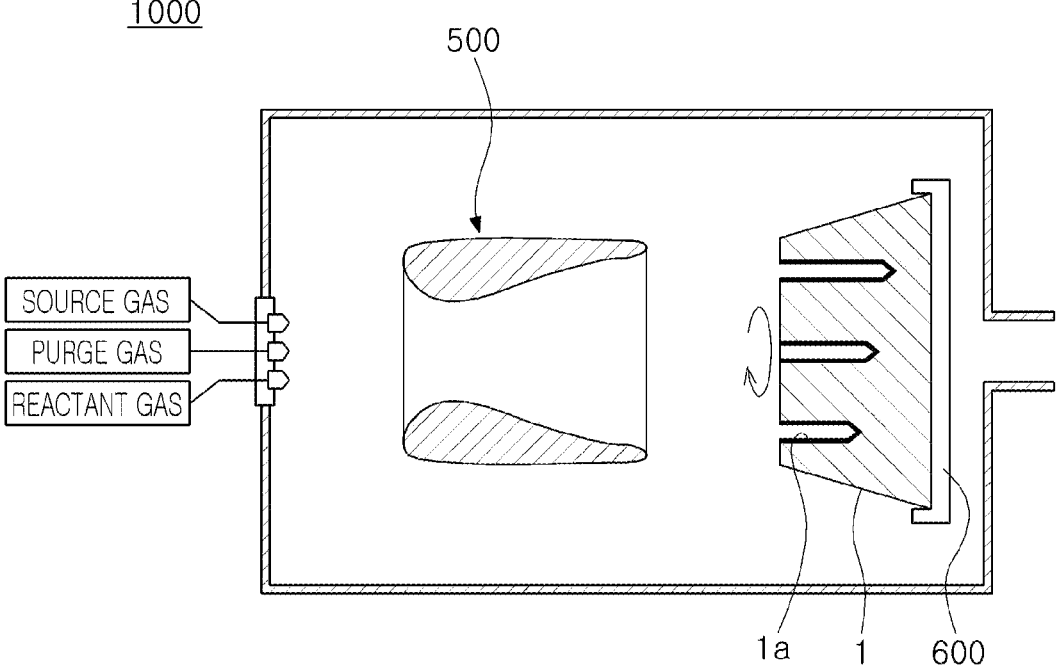
Figure 13:
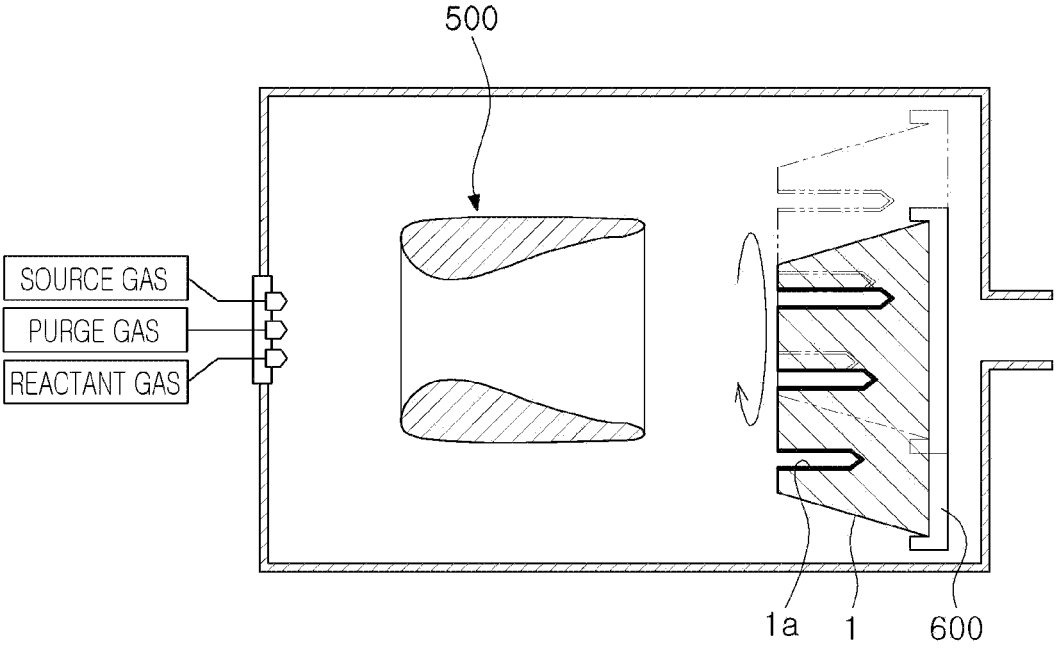

Specifically, FIG. 10 is a view illustrating that an object to be deposited moves in position, FIG. 11 is a view illustrating that an object to be deposited tilts, FIG. 12 is a view illustrating that an object to be deposited rotates, and FIG. 13 illustrates that an object to be deposited revolves. It is a drawing illustrating that Referring to the drawings, the apparatus 1000 for depositing a thin film of the present disclosure may further include a holder 600 and an object driving unit 602. For reference, reference numeral 500 in FIGS. 10 to 13 denotes the flow velocity increasing device described above.

The holder 600 is disposed in the chamber 400 and holds the object 1 to be deposited. The holder 600 is a member that grips the object 1 to be deposited, but the present disclosure is not limited thereto and any conventional member that firmly and stably holds the object 1 to be deposited may also be utilized.

Also, as illustrated in FIG. 10, the object driving unit 602 is connected to the holder 600 and moves the holder 600 so that the object 1 to be deposited is moved. That is, the object driving unit 602 may be connected to the holder 600 and is configured to move the holder 600 so that the position of the object 1 to be deposited may be moved. This object driving unit 602 is a driving member that may be operated by a driving source, such as electricity, but the present disclosure is not limited thereto and any conventional driving member may be utilized as long as the member smoothly moves the holder 600 in position.

For example, as illustrated in FIG. 10, when the size of the object 1 to be deposited is large and a plurality of holes 1a are formed in a wide range, in the present disclosure, the object 1 to be deposited may be moved in position by moving the holder 600 by the object driving unit 602, thereby performing uniform thin film deposition coating on the entire portion of the object 1 to be deposited.

Also, the apparatus 1000 for depositing a thin film of the present disclosure may further include an object tilting unit 604. As illustrated in FIG. 11, the object tilting unit 604 is connected to the holder 600 to tilt the holder 600 so that the object 1 to be deposited is tilted. That is, the object tilting unit 604 has a structure connected to the holder 600 and is configured to tilt the holder 600 so that the object 1 to be deposited may be tilted. This tilting unit 604 is a tilting member that may be operated by a driving source of electricity, and the present disclosure is not limited thereto and any conventional tilting member may be utilized as long as it is a member that smoothly tilts the holder 600.

For example, as illustrated in FIG. 11, when the size of the object 1 to be deposited is large and some of the holes 1a are formed to be inclined, in the present disclosure, the object 1 to be deposited may be tilted by tilting the holder 600 by the object tilting unit 604, thereby performing a uniform thin film deposition coating on the entire portion of the object 1 to be deposited.

Meanwhile, the apparatus 1000 for depositing a thin film of the present disclosure may further include an object rotating unit 606. As illustrated in FIG. 12, the object rotating unit 606 is connected to the holder 60 to rotate the holder 600 so that the object 1 to be deposited rotates. That is, the object rotating unit 606 has a structure connected to the holder 600 and is configured to rotate the holder 600 so that the object 1 to be deposited may rotate. This object rotating unit 606 is a driving member that may be operated by a driving source of electricity, and according to the present disclosure, any conventional driving member may be utilized as long as it is not rotated but rotates the holder 600 smoothly.

For example, as illustrated in FIG. 12, when the lengths of a plurality of holes 1a in the object 1 to be deposited are formed to be different, in the present disclosure, the object 1 to be deposited may be rotated by rotating the holder 600 by the object rotating unit 606, thereby performing a uniform thin film deposition coating on the entire portion of the object 1 to be deposited.

Also, the apparatus 1000 for depositing a thin film of the present disclosure may further include an object revolving unit 608. As illustrated in FIG. 13, the object revolving unit 608 is connected to the holder 600 and configured to rotate the holder 600 so that the object 1 to be deposited rotates. That is, the object revolving unit 608 has a structure connected to the holder 600 and is configured to rotate the holder 600 so that the object 1 to be deposited rotates. This object revolving unit 608 is a driving member that may be operated by a driving source such as electricity, and any conventional driving member may be utilized as long as it is not revolved but revolves the holder 600 smoothly.

For example, as illustrated in FIG. 13, when a plurality of holes 1a are formed to have different lengths in the object 1 to be deposited, in the present, the object 1 to be deposited is revolved by revolving the holder 600 by the object revolving unit 608, thereby performing a uniform thin film deposition coating on the entire portion of the object 1 to be deposited.

Figure 14:
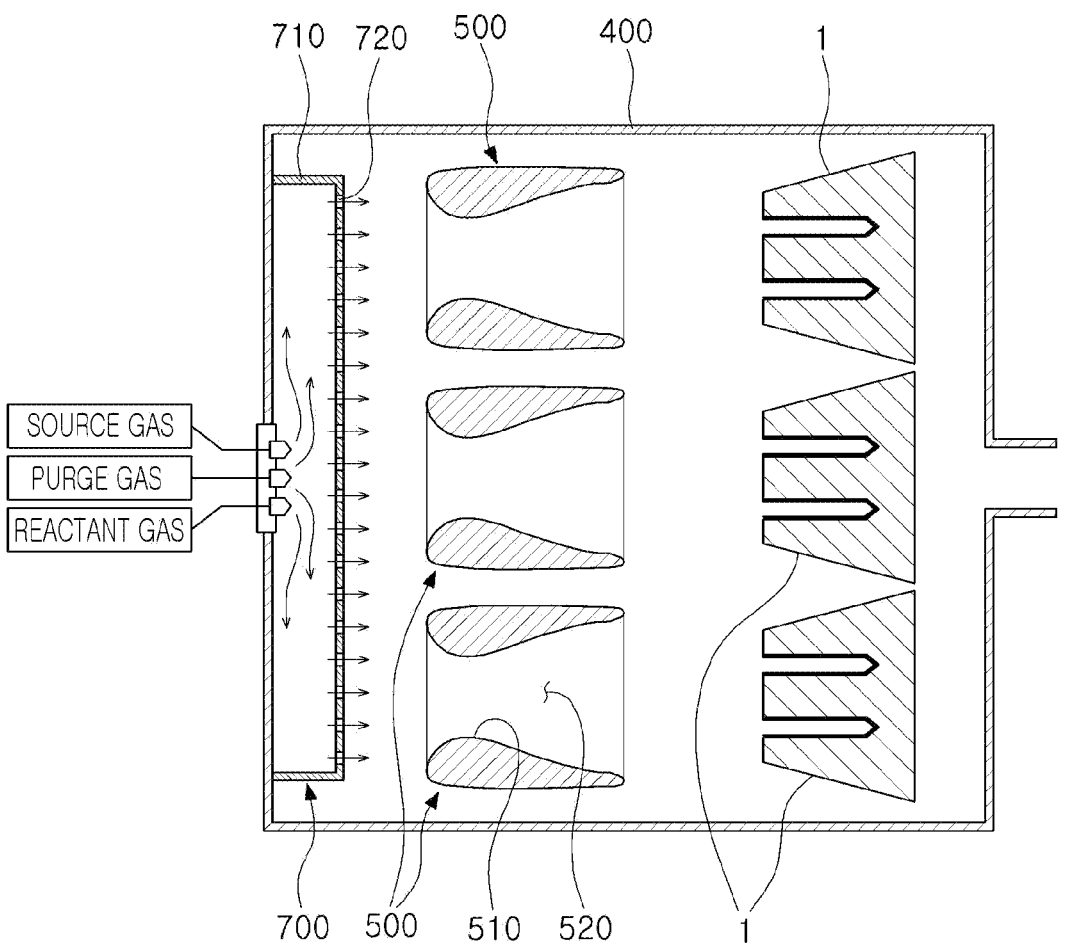
FIG. 14 is a view illustrating an apparatus for depositing a thin film according to a fifth exemplary embodiment in the present disclosure.

FIG. 14 is a view illustrating an apparatus for depositing a thin film according to a fifth exemplary embodiment in the present disclosure.

Specifically, FIG. 14 is a view illustrating that a gas distribution unit is disposed in front of the flow velocity increasing device of FIG. 9. For reference, reference numeral 1 is an object to be deposited.

Referring to the drawing, the present disclosure may further include a gas distribution unit 700. The gas distribution unit 700 is disposed between the gas injection portion 410 and the flow velocity increasing device 500 to distribute gas injected through the gas injection portion 410. The gas distribution unit 700 may include a distribution housing 710 and a distribution hole portion 720. The distribution housing 710 communicates with the gas injection portion 410 and has a gas accommodating space therein. In addition, the distribution hole portion 720 is formed at the rear end of the distribution housing 710 disposed to be adjacent to the flow velocity increasing device 500, and a plurality of distribution hole portions are spaced apart from each other at a predetermined interval.

The gas injected into the chamber 400 through the gas injection portion 410 by the gas distribution unit 700 configured as above first fills the distribution housing 710 of the gas distribution unit 700, and then is evenly distributed by the plurality of distribution hole portions to flow to the flow velocity increasing device 500.

In the apparatus for depositing a thin film having the flow velocity increasing device according to the present disclosure, since the flow velocity increasing device having a flow velocity increasing hole portion is configured, gas injected into a chamber may be introduced at a high flow velocity into a space with one side closed, such as a closed hole or to various steps of an object to be deposited, circulating power of gas may increase, so that thin film deposition may be performed uniformly and effectively.

While example exemplary embodiments have been illustrated and described above, it will be apparent to those skilled in the art that modifications and variations could be made without departing from the scope of the present disclosure as defined by the appended claims.

The invention claimed is:

1. An apparatus for depositing a thin film, the apparatus comprising:
   a chamber having a gas injection portion including a source gas nozzle, a reactant gas nozzle, and a purge gas nozzle, and a gas discharge port;
   a vacuum pump connected to the chamber; and
   a flow velocity increasing device disposed within the chamber,
   wherein the flow velocity increasing device includes:
      a device body disposed within the chamber;
      a flow velocity increasing hole portion formed in the device body and tapered in a direction of gas passage and configured to cause a flow velocity of passed gas to be faster than that externally to increase a circulating power of the passed gas to enhance uniform thin film deposition in at least one of enclosed regions or stepped surfaces of an object;
      a holder disposed in the chamber and configured to hold an object to be deposited;
      an object rotating unit connected to the holder and configured to rotate the holder so that the object to be deposited rotates; and
      an object revolving unit connected to the holder and configured to revolve the holder so that the object to be deposited revolves.

2. The apparatus of claim 1, wherein in the flow velocity increasing hole portion,
   a gas inlet through which gas flows in and a gas outlet through which gas flows out are formed, and
   a flow velocity increasing portion connecting the gas inlet and the gas outlet and having a smaller cross-sectional area than the gas inlet and the gas outlet is formed.

3. The apparatus of claim 1, wherein an inner surface of the flow velocity increasing portion is inwardly convex, and a front end of the device body disposed around the gas inlet is curved.

4. The apparatus of claim 1, wherein the flow velocity increasing hole has a length direction disposed on an extension of a direction in which a gas is injected through the gas injection portion.

5. The apparatus of claim 1, further comprising:

a device driving unit connected to the device body and configured to move a position of the device body so that a position of the flow velocity increasing hole portion is moved; and a device tilting unit connected to the device body and configured to tilt the device body so that the flow velocity increasing hole portion is tilted.

6. The apparatus of claim 1, further comprising:

an object driving unit connected to the holder and moving a position of the holder so that the object to be deposited is moved; and an object tilting unit connected to the holder and tilting the holder so that the object to be deposited is tilted.

7. The apparatus of claim 1, wherein the device body is provided in plural and the plurality of device bodies are arranged not to interfere with each other in a gas passage direction through the flow velocity increasing hole portion.

8. The apparatus of claim 1, further comprising:

a gas distribution unit disposed between the gas injection portion and the flow velocity increasing device to distribute a gas injected through the gas injection portion, wherein the gas distribution unit includes:

a distribution housing communicating with the gas injection portion and having a gas accommodating space therein; and a plurality of distribution holes formed at a rear end of the distribution housing disposed to be adjacent to the flow velocity increasing device and spaced apart from each other at a predetermined interval.

9. An apparatus for depositing a thin film, the apparatus comprising:

a source gas supply tank supplying a source gas;

a reactant gas supply tank supplying a reactant gas;

a purge gas supply tank supplying purge gas;

a chamber having a gas injection portion including a source gas nozzle connected to the source gas supply tank, a reactant gas nozzle connected to the reactant gas supply tank, and a purge gas nozzle connected to the purge gas supply tank, and a gas discharge port;

a vacuum pump connected to the chamber;

a flow velocity increasing device disposed within the chamber, wherein the flow velocity increasing device includes:

a device body disposed within the chamber; and a flow velocity increasing hole portion formed in the device body and tapered in a direction of gas passage and configured to cause a flow velocity of passed gas to be faster than that externally to increase a circulating power of the passed gas to enhance uniform thin film deposition in at least one of enclosed regions or stepped surfaces of an object;

a holder disposed in the chamber and configured to hold an object to be deposited;

an object rotating unit connected to the holder and configured to rotate the holder so that the object to be deposited rotates; and an object revolving unit connected to the holder and configured to revolve the holder so that the object to be deposited revolves.

10. The apparatus of claim 9, wherein in the flow velocity increasing hole portion, a gas inlet through which gas flows in and a gas outlet through which gas flows out are formed, and a flow velocity increasing portion connecting the gas inlet and the gas outlet and having a smaller cross-sectional area than the gas inlet and the gas outlet is formed, and wherein an inner surface of the flow velocity increasing portion is inwardly convex, and a front end of the device body disposed around the gas inlet.

\* \* \* \* \*